(12) United States Patent
Lu

(10) Patent No.: US 12,045,102 B2
(45) Date of Patent: Jul. 23, 2024

(54) POWER SUPPLY WITH PASSIVE CONDUCTIVE AND CONVECTIVE COOLING

(71) Applicant: AA Power Inc., Boston, MA (US)

(72) Inventor: Qun Lu, Lexington, MA (US)

(73) Assignee: AA Power Inc., Boston, MA (US)

( * ) Notice: Subject to any disclaimer, the term of this patent is extended or adjusted under 35 U.S.C. 154(b) by 142 days.

(21) Appl. No.: 17/834,199

(22) Filed: Jun. 7, 2022

(65) Prior Publication Data

US 2022/0390994 A1    Dec. 8, 2022

Related U.S. Application Data

(60) Provisional application No. 63/290,413, filed on Dec. 16, 2021, provisional application No. 63/208,195, filed on Jun. 8, 2021.

(51) Int. Cl.
*G06F 1/20*      (2006.01)
*G06F 1/26*      (2006.01)
*H05K 7/20*     (2006.01)

(52) U.S. Cl.
CPC ............... *G06F 1/20* (2013.01); *G06F 1/26* (2013.01); *H05K 7/20127* (2013.01); *H05K 7/20136* (2013.01); *H05K 7/20736* (2013.01)

(58) Field of Classification Search
None
See application file for complete search history.

(56) References Cited

U.S. PATENT DOCUMENTS

| | | | |
|---|---|---|---|
| 7,333,330 B2* | 2/2008 | McEwan | G06F 1/20 |
| | | | 361/679.48 |
| 9,253,919 B2* | 2/2016 | Lee | H05K 7/20172 |
| 9,629,265 B2* | 4/2017 | Nagasaka | H05K 7/20145 |
| 9,872,417 B2* | 1/2018 | Held | H05K 7/20727 |

* cited by examiner

*Primary Examiner* — Mukundbhai G Patel
(74) *Attorney, Agent, or Firm* — Occhiuti & Rohlicek LLP

(57) ABSTRACT

An AC/DC power supply for providing power to a processing device includes a power-supply housing and power-handling units connected to the power-supply housing to permit flow of heat to the power-supply housing by conduction. The power-supply housing comprises an intake port and an exhaust port that have been configured to use moving coolant fluid that made to move by a fan on the processing device to cause convective cooling of the power-handling units.

20 Claims, 5 Drawing Sheets

POWER SUPPLY WITH PASSIVE CONDUCTIVE AND CONVECTIVE COOLING

RELATED APPLICATIONS

This application claims the benefit of the Jun. 8, 2021 priority date of U.S. Provisional Application 63/208,195 and the Dec. 16, 2021 priority date of U.S. Provisional Application 63/290,413, the contents of both of which are incorporated herein by reference.

TECHNICAL FIELD

The invention concerns power supplies, and in particular, to cooling a power supply.

BACKGROUND

With the growing popularity of virtual currency, it has become necessary to provide currency-mining machines to mine for such currency. These currency-mining machines, which are referred to herein as "miners" for brevity, require considerable power to operate. This power is provided by a power supply that converts AC voltage into the DC voltage required for operating a miner.

A side effect of such power is the generation of heat by the various circuits that convert AC to DC. Since excessive heat accumulation is undesirable, it is usual to provide a cooling mechanism. A typical power supply uses a fan to promote heat dissipation.

Although a fan is effective at heat dissipation, it carries some disadvantages. First, the fan itself has a cost. Secondly, the fan requires additional power to spin. Third, the fan, like any mechanical part, is vulnerable to breakdown.

It is also possible to use a liquid cooling system. While this avoids the problems of dust, a liquid cooling system is also vulnerable and also consumes power.

SUMMARY

In one aspect, the invention features a passively-cooled power supply for providing power to a processing device. The power supply lacks its own fan and instead relies on a fan that is part of the processing devices for which it supplies power.

Embodiments include those in which the power supply is an ac/dc power supply and those in which the power supply is a dc/dc power supply.

In another aspect, the invention features a power supply for providing power to a processing device. The power supply includes a power-supply housing and power-handling units connected to the power-supply housing to permit flow of heat to the power-supply housing by conduction. The power-supply housing comprises an intake port and an exhaust port that have been configured to use a coolant fluid that is moved by a fan on the processing device to cause convective cooling of the power-handling units.

In some embodiments, the power-supply housing is configured to cause the moving fluid to drive a cooling current from the intake port to the exhaust port of the power-supply housing to provide convective cooling to the power-handling units.

In other embodiments, the exhaust port is configured such that when the power supply is exposed to the moving fluid, a low-pressure zone forms at the exhaust port, thereby drawing fluid into the power-supply housing through the intake port.

Also among the embodiments are those that include a server having a server housing and a fan that causes the fluid to move. The power supply is disposed inside the server housing such that the intake port is on a windward side of the power-supply housing relative to the moving fluid and the exhaust port is on a leeward side of the power-supply housing relative to the moving fluid.

Still other embodiments feature a miner having an exhaust fan that causes the moving fluid, wherein the power supply is disposed on the miner. In such embodiments, the power-supply housing further comprises a chimney that receives the moving fluid and directs the moving fluid towards the exhaust port. In other embodiments, the power-supply housing forms a channel that directs the moving fluid towards the exhaust port. In such embodiments, the channel has a throat, or constrictions, through which the moving fluid passes.

Still other embodiments are those in which the exhaust port comprise a vane that divides the exhaust port into a lower channel and an upper channel. The moving fluid passes through the lower channel and the cooling current passes through the upper channel. Among these embodiments are those in which the vane protrudes from the power-supply housing.

In still other embodiments, the intake port and the exhaust port have been configured to use moving fluid that has been heated. This heated moving fluid is then used to cause convective cooling of the power-handling units.

Also among the embodiments are those that further include a mining machine. In such embodiments, the processing device is disposed in the mining machine and power-supply housing receives warm fluid exhausted from the mining machine.

Additional embodiments include a server for a data center and a server housing for housing the server. In such embodiments, the power-supply housing is disposed within the server housing and the power-supply housing has openings for permitting fluid drawn through the server housing to pass through the power-supply housing.

Embodiments further include those in which the coolant fluid is air, those in which it is gas other than air, those in which it is a liquid, including those in which it is an electrically-inert liquid in which the power supply has been immersed, and those in which it is a multi-phase fluid.

In another aspect, the invention features a negative-pressure device and a power supply. The power supply includes a power-supply housing and power-handling units connected to the power-supply housing to permit flow of heat to the power-supply housing by conduction. In operation, it provides power to a processing device. The power-supply housing includes an intake port and an exhaust port. The power-supply housing's exhaust port connects to a horizontally-facing channel intake of the negative-pressure device. This horizontally-facing channel intake connects to an L-shaped channel that leads to an upwardly-facing exhaust port.

Among the embodiments are those in which the negative-pressure device comprises a horizontally-facing channel intake, an upwardly-facing channel outlet, and an L-shaped channel extending therebetween. The channel intake connects to the exhaust port of said the supply.

In another aspect, the invention features a method that includes coupling an intake port of a power supply to an exhaust of a processing device, causing a fan on the processing device to move air for cooling the processing device, and causing air warmed by the processing device and exiting the exhaust of the processing device to carry out convective cooling of power-handling units in the power supply.

These and other features of the invention will be apparent from the following detailed description and the accompanying figures, in which:

DESCRIPTION OF DRAWINGS

Within the drawings, the same or corresponding reference numerals indicate the same or corresponding parts.

DETAILED DESCRIPTION

Figure 1:
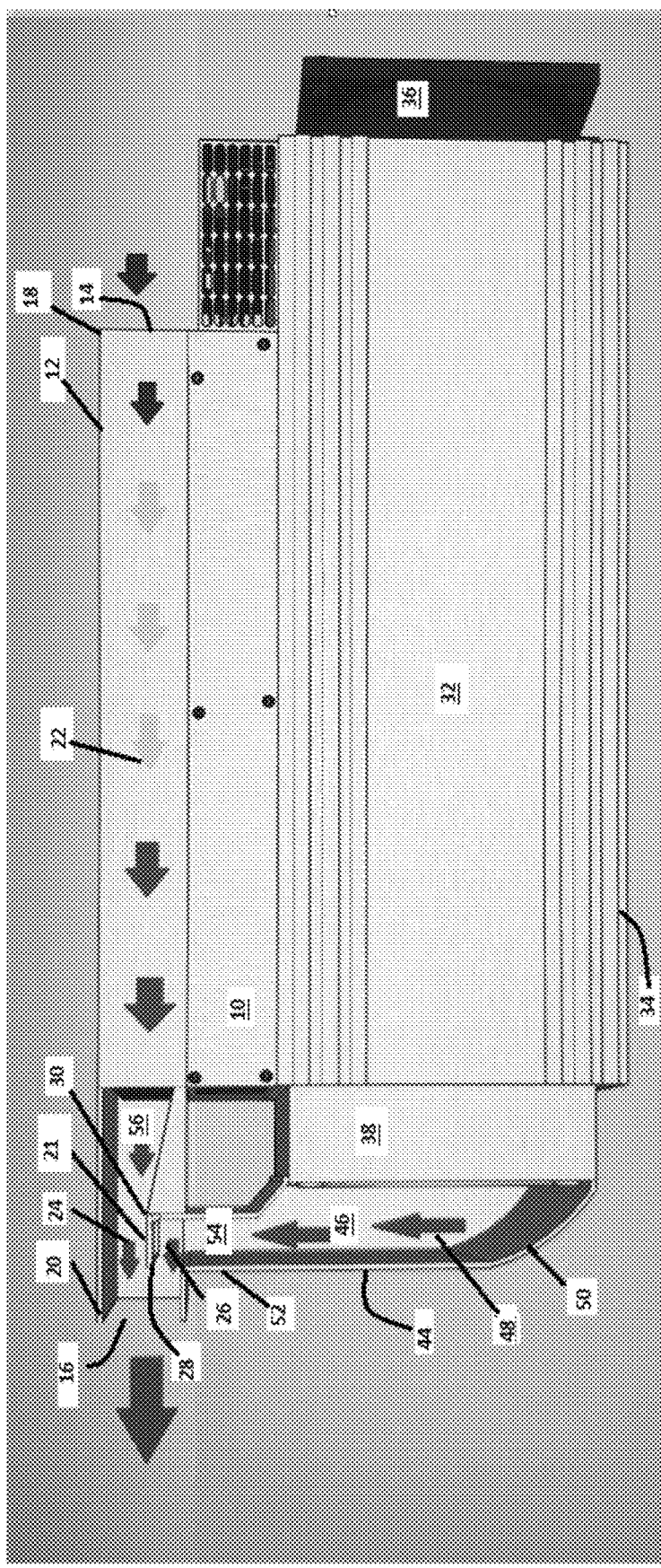
FIG. 1 shows a power supply using heated exhaust air from a miner to cool components in the power supply.

FIG. 1 shows a power supply 10 having a power-supply housing 12 that encloses various power-generating components. These power-generating components, which emit considerable amounts of heat, are in thermal communication with the power-supply housing 12. As a result, heat flows directly from the power-generating components to the power-supply housing 12 via heat conduction.

The power-supply housing 12 includes an intake port 14 and an exhaust port 16 at corresponding front and rear ends 18, 20 thereof. A cooling air current 22 flows through the power-supply housing 12 between the intake and exhaust ports 14, 16. The power-generating components are thus cooled by both heat-conduction and the air current 22.

In the embodiment shown in FIG. 1, the exhaust port 16 features a rearwardly-extending vane 21 that divides the exhaust port 16 into an upper and lower channel 24, 26. In the illustrated embodiment, the upper and lower channels 24, 26 are about the same size. However, in other embodiments, the upper and lower channels 24, 26 differ in size.

In some embodiments, the vane 21 protrudes beyond the exhaust port 16. This protrusion tends to suppress turbulence induced at the vane's distal end 28, which would otherwise disturb the flow of air along the vane's proximal end 30.

The cooling current 22 enters the power-supply housing 12 through the intake port 14 and exits the power-supply housing 12 via the upper channel 24 of the exhaust port 16.

The power supply 10 is disposed on a miner 32. The miner 32 includes a housing 34 that has an intake fan 36 and an exhaust fan 38 and respective front and rear ends 40, 42 thereof. The intake fan 36 and exhaust fan 38 cooperate to draw ambient air into the housing 34, to pass it over the components of the miner 32, and to exhaust the now-heated air out the exhaust fan 38. This cools the components of the miner 32.

The power supply 10 makes use of the miner's exhaust to draw air into an intake port 14 and to cause that air to travel through the interior of the power-supply housing 12 and out an exhaust port 16. To do so, the power supply features a chimney 44.

The chimney 44 defines a chimney channel 46 that channels a traction stream 48, so called for its ability to pull the cooling current 22, from its lower end 50 to its upper end 52. The lower end 50 receives heated air from the exhaust fan 38. The upper end 52 empties into the lower channel 26 of the exhaust port 16.

Between the upper and lower end 50, 52 is a chimney throat 54 that narrows the chimney channel 46. The narrowing throat accelerates the fluid velocity in the traction stream 48. A similar exhaust throat 56 upstream of the exhaust port 16 accelerates fluid flow in the cooling current 22.

In the illustrated embodiment, the chimney channel 46 is completely enclosed. As a result, the entire traction stream 48 enters the lower channel 26. However, in some embodiments, the chimney 44 features a window. Such a window can be used to bleed some of the traction stream 48.

In operation, the exhaust fan 38 drives warm air from the miner 32 into the chimney 44. In so doing, it establishes the traction stream 48. The traction stream 48 eventually reaches the lower channel 26 of the power-supply housing's exhaust port 16. As it flows out the lower channel 26 of the power-supply housing's exhaust port 16, the traction stream 48 establishes a low-pressure zone at the exhaust port 16, including the upper channel 24 of the exhaust port 16. This low-pressure zone drives a rearward flow of air through the power-supply housing 12, thus establishing the cooling stream.

In the illustrated embodiment, the traction stream 48 is tapped just downstream of the exhaust fan 38. However, in principle it is possible to tap the traction stream 48 anywhere between the miner's front end 40 and the miner's read end 42. This, however, is disadvantageous since it would require making a hole through both the power-supply housing 12 and the miner housing 34. Such a hole raises the possibility of electromagnetic interference within the miner 32 as a result of the power supply's activity.

The traction stream 48 provides a pressure differential between the front and rear ends 18, 20 of the power-supply housing 12. However, this can also be achieved by placing the power-supply housing 12 such that the intake port 14 is windward and the exhaust port 18 is leeward.

Figure 2:
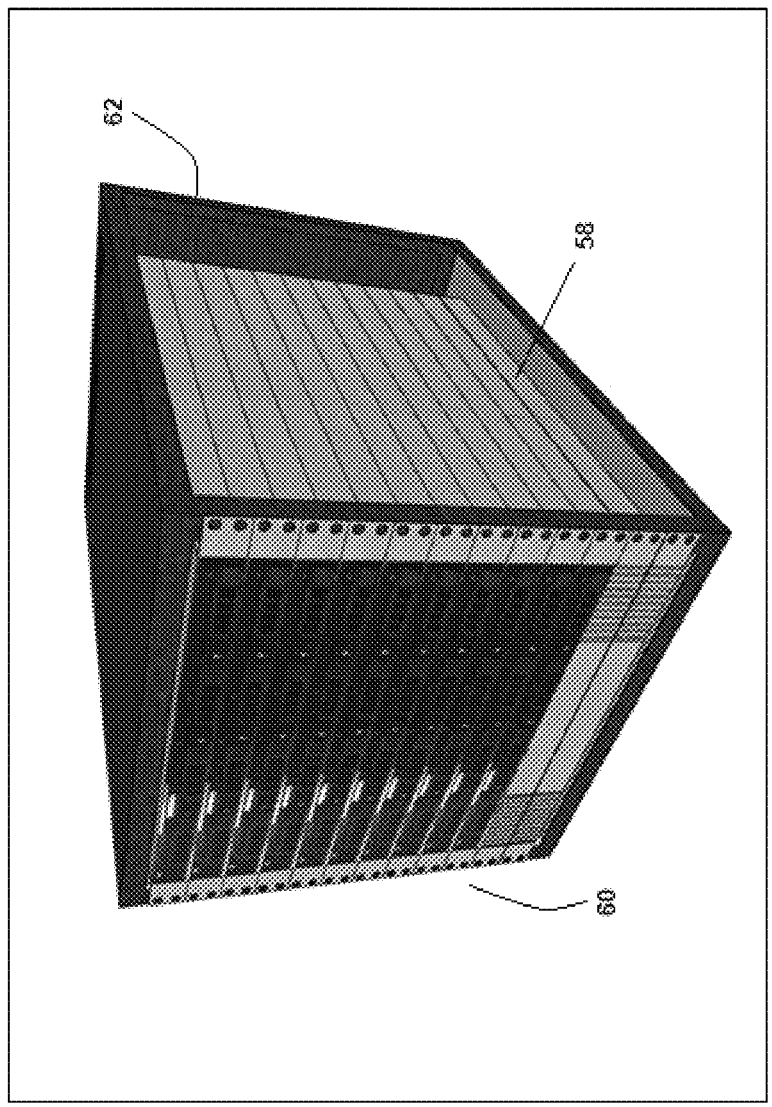
FIG. 2 shows a rack having housings stacked on each other, each housing having a server housed therein.

An example of such strategic placement of the power-supply housing 12 arises when cooling a server, such as one might find in a data center. As shown in FIG. 2, in such servers, the server's computational components are placed in a server housing 58. This server housing 58 is relatively thin, much like a pizza box. FIG. 2 shows a server rack 60 that supports a stack 62 of such server housings 58 such as one might find in a data center.

Figure 3:
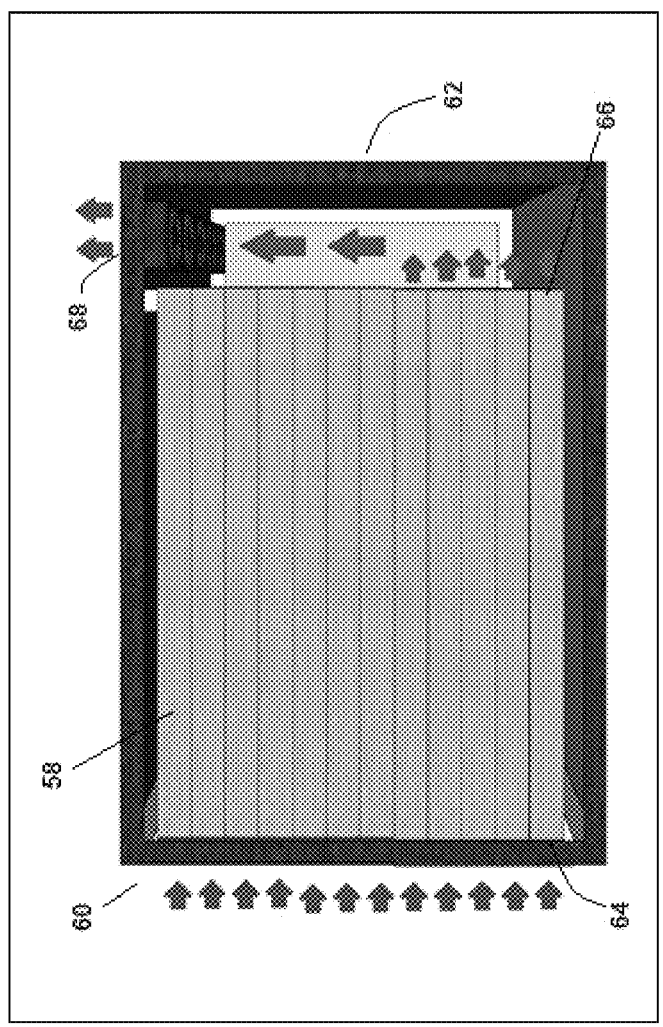
FIG. 3 shows airflow through the housings shown in the rack of FIG. 2.

As shown in FIG. 3, an intake fan 64 draws cool air into the server housing 58 and an exhaust fan 66 draws warmed air out of the server housing 58. This warmed air escapes through a rack exhaust 68 on an upper end of the server rack 60.

Figure 4:
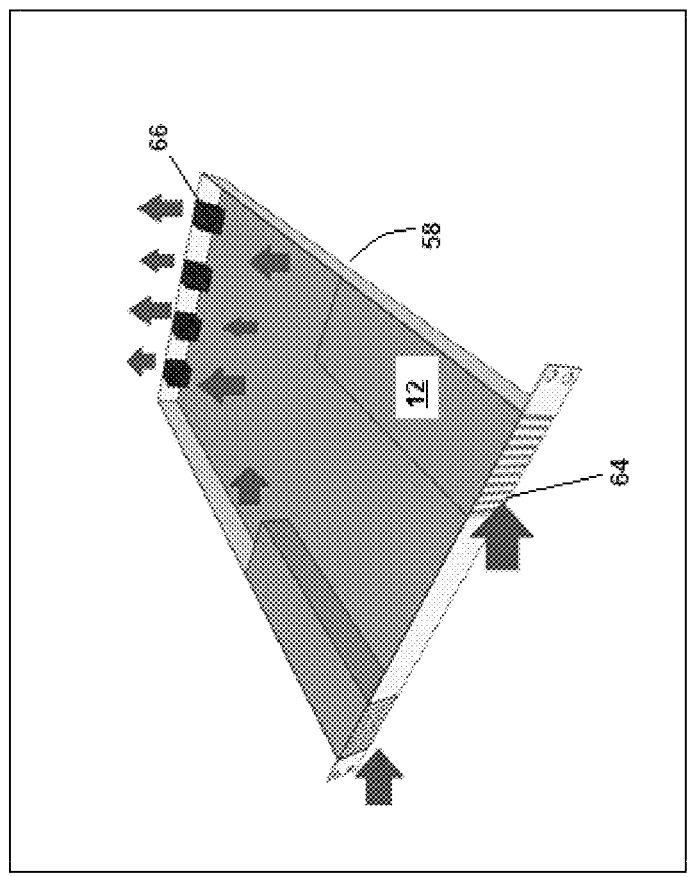
FIG. 4 shows the power supply of FIG. 1 incorporated into one of the housings of FIG. 2.

As shown in FIG. 4, because the server housing 58 is so thin, the intake fan 64 and exhaust fan 66 cooperate to generate enough flow velocity to cause a significant pressure difference between windward and leeward ends of the power-supply housing 12, thereby causing a cooling current to flow through the power-supply housing 12. This cooling current 22 removes both heat generated within the server housing 58 as well as any additional heat generated by server housings that lie below the particular housing 58.

In either case, the power supply 10 cools passively by a combination of conduction, through thermally-conductive connections between power-handling components and the power-supply's housing 12 and by convection, using kinetic energy imparted to air from a fan that is already being used to cool a processing device for which the power supply 10 is supplying power.

Figure 5:
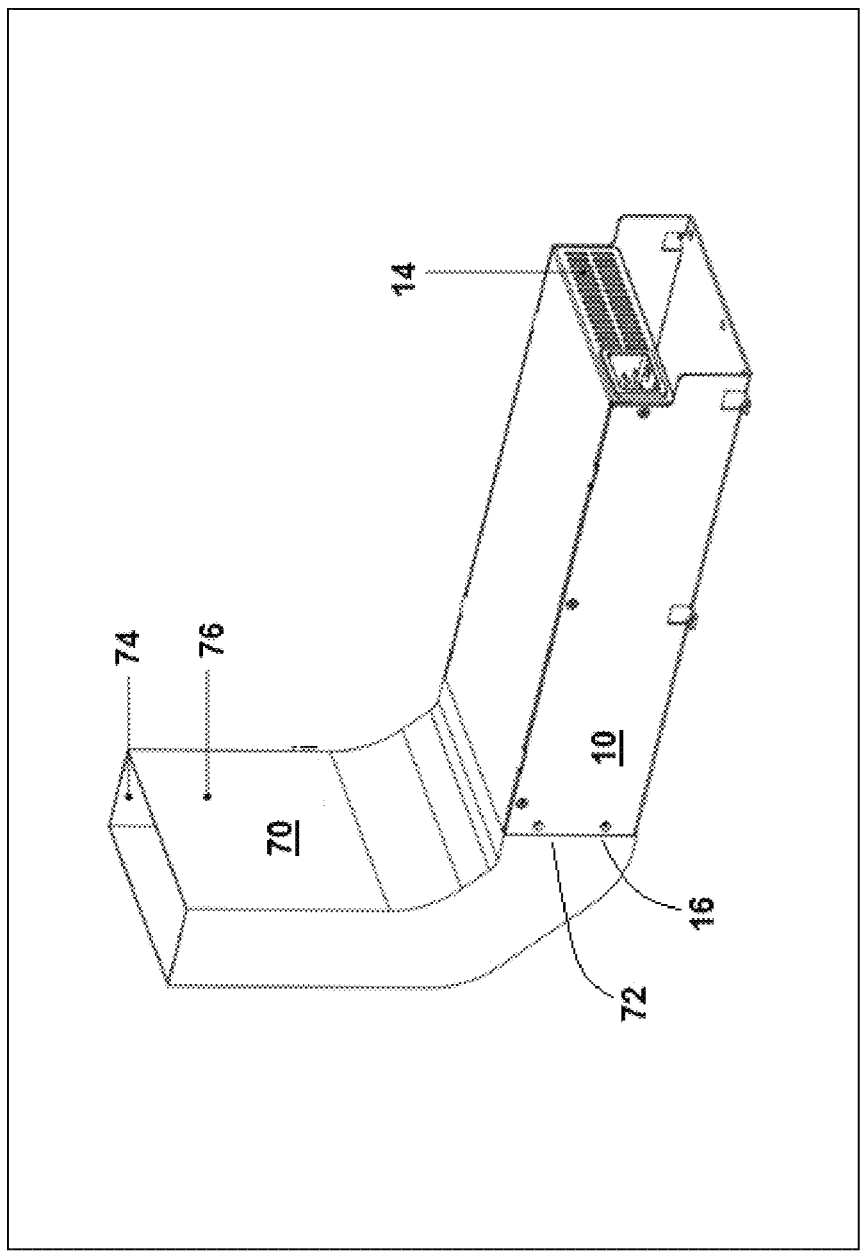
FIG. 5 shows an alternative way to promote cooling of heated exhaust from the miner shown in FIG. 1.

In another embodiment, shown in FIG. 5, a negative-pressure device 70 comprises a horizontally-facing channel intake 72, an upwardly-facing channel outlet 74, and an L-shaped channel 76 extending therebetween. The channel intake 72 connects to the exhaust port 16 of the power supply 10. Suitable materials for use in making the negative-pressure device 70 include sheet metal and plastic.

During the power supply's operation, heated air flows into the channel intake 72 and, being less dense than ambient air, rises up the L-shaped channel 76 before finally exiting the negative-pressure device 70 through the channel outlet 74. This results in a region near the channel outlet 74 of air that is less dense than that at the power supply's intake port 14. The resulting pressure differential encourages the cooling current 22 and does so passively, without the need for a fan.

It is to be understood that the foregoing description is intended to illustrate and not to limit the scope of the invention, which is defined by the scope of the appended claims. Other embodiments are within the scope of the following claims.

What is claimed is:

1. An apparatus comprising a power supply for providing power to a processing device, said power supply comprising a power-supply housing and power-handling units connected to said power-supply housing to which heat flows by conduction, wherein said power-supply housing comprises an intake port and an exhaust port that have been configured to use a coolant fluid that is made to move by a fan on said processing device to cause convective cooling of said power-handling units, wherein said exhaust port comprises a vane that divides said exhaust port into a lower channel and an upper channel, wherein said moving fluid passes through said lower channel and said cooling current passes through said upper channel.

2. The apparatus of claim 1, wherein said power-supply housing is configured to cause said moving fluid to drive a cooling current from said intake port to said exhaust port of said power-supply housing to provide convective cooling to said power-handling units.

3. The apparatus of claim 1, wherein said exhaust port is configured such that when said power supply is exposed to said moving air, a low-pressure zone forms at said exhaust port, thereby drawing fluid into said power-supply housing through said intake port.

4. The apparatus of claim 1, further comprising a server having a server housing and a fan that causes said moving fluid and wherein said power supply is disposed inside said server housing such that said intake port is on a windward side of said power-supply housing relative to said moving fluid and said exhaust port is on a leeward side of said power-supply housing relative to said moving fluid.

5. The apparatus of claim 1, further comprising a miner having an exhaust fan that causes said moving fluid, wherein said power supply is disposed on said miner, and wherein said power-supply housing further comprises a chimney that receives said moving fluid and directs said moving fluid towards said exhaust port.

6. The apparatus of claim 1, further comprising a miner having an exhaust fan that causes said moving fluid, wherein said power supply is disposed on said miner, and wherein said power-supply housing forms a channel that directs said moving fluid towards said exhaust port, said channel having a throat through which said moving fluid passes.

7. The apparatus of claim 1, wherein said intake port and said exhaust port have been configured to use moving fluid that has been heated, said heated moving fluid being used to cause convective cooling of said power-handling units.

8. The apparatus of claim 1, further comprising a mining machine, wherein said processing device is disposed in said mining machine and power-supply housing receives warm fluid exhausted from said mining machine.

9. The apparatus of claim 1, further comprising a server for a data center and a server housing for housing said server, wherein said power-supply housing is disposed within said server housing, and wherein said power-supply housing comprises openings for permitting fluid drawn through said server housing to pass through said power-supply housing.

10. The apparatus of claim 1, wherein said fluid is air.

11. An apparatus comprising a power supply for providing power to a processing device, said power supply comprising a power-supply housing to which heat flows by conduction, wherein said power-supply housing comprises an intake port and an exhaust port that have been configured to use a coolant fluid that is made to move by a fan on said processing device to cause convective cooling of said power-handling units, wherein said exhaust port comprise a vane that divides said exhaust port into a lower channel and an upper channel, wherein said vane protrudes from said power-supply housing.

12. The apparatus of claim 11, wherein said power-supply housing is configured to cause said moving fluid to drive a cooling current from said intake port to said exhaust port of said power-supply housing to provide convective cooling to said power-handling units.

13. The apparatus of claim 11, further comprising a mining machine, wherein said processing device is disposed in said mining machine and power-supply housing receives warm fluid exhausted from said mining machine.

14. The apparatus of claim 11, further comprising a server for a data center and a server housing for housing said server, wherein said power-supply housing is disposed within said server housing, and wherein said power-supply housing comprises openings for permitting fluid drawn through said server housing to pass through said power-supply housing.

15. The apparatus of claim 11, wherein said fluid is air.

16. The apparatus of claim 11, wherein said exhaust port is configured such that when said power supply is exposed to said moving air, a low-pressure zone forms at said exhaust port, thereby drawing fluid into said power-supply housing through said intake port.

17. The apparatus of claim 11, further comprising a server having a server housing and a fan that causes said moving fluid and wherein said power supply is disposed inside said server housing such that said intake port is on a windward side of said power-supply housing relative to said moving fluid and said exhaust port is on a leeward side of said power-supply housing relative to said moving fluid.

18. The apparatus of claim 11, further comprising a miner having an exhaust fan that causes said moving fluid, wherein said power supply is disposed on said miner, and wherein said power-supply housing further comprises a chimney that receives said moving fluid and directs said moving fluid towards said exhaust port.

19. The apparatus of claim 11, further comprising a miner having an exhaust fan that causes said moving fluid, wherein said power supply is disposed on said miner, and wherein said power-supply housing forms a channel that directs said moving fluid towards said exhaust port, said channel having a throat through which said moving fluid passes.

20. The apparatus of claim 11, wherein said intake port and said exhaust port have been configured to use moving fluid that has been heated, said heated moving fluid being used to cause convective cooling of said power-handling units.

\* \* \* \* \*